United States Patent
Gao

(10) Patent No.: US 11,140,799 B2
(45) Date of Patent: Oct. 5, 2021

(54) INROW LIQUID COOLING MODULE

(71) Applicant: Baidu USA LLC, Sunnyvale, CA (US)

(72) Inventor: Tianyi Gao, Sunnyvale, CA (US)

(73) Assignee: BAIDU USA LLC, Sunnyvale, CA (US)

( * ) Notice: Subject to any disclaimer, the term of this patent is extended or adjusted under 35 U.S.C. 154(b) by 0 days.

(21) Appl. No.: 16/575,237

(22) Filed: Sep. 18, 2019

(65) Prior Publication Data

US 2021/0084796 A1 Mar. 18, 2021

(51) Int. Cl.
*H05K 7/20* (2006.01)
*F24F 11/84* (2018.01)

(52) U.S. Cl.
CPC .......... *H05K 7/20718* (2013.01); *F24F 11/84* (2018.01); *H05K 7/20272* (2013.01); *H05K 7/20763* (2013.01); *H05K 7/20836* (2013.01); *H05K 7/20254* (2013.01); *H05K 7/20772* (2013.01); *H05K 7/20781* (2013.01)

(58) Field of Classification Search
CPC .......................... H05K 7/20627–20645; H05K 7/20763–20781; H05K 7/20272; H05K 7/20218
See application file for complete search history.

(56) References Cited

U.S. PATENT DOCUMENTS

| | | | | |
|---|---|---|---|---|
| 7,639,499 B1 * | 12/2009 | Campbell | .......... | H05K 7/20772 165/104.19 |
| 7,983,040 B2 * | 7/2011 | Campbell | .......... | H05K 7/20772 165/104.33 |
| 8,351,206 B2 * | 1/2013 | Campbell | .......... | H05K 7/20809 361/700 |
| 9,451,726 B2 * | 9/2016 | Regimbal | .......... | H05K 7/20272 |
| 9,839,164 B2 * | 12/2017 | Shelnutt | ............ | H05K 7/20772 |

* cited by examiner

*Primary Examiner* — Zachary Pape
(74) *Attorney, Agent, or Firm* — Womble Bond Dickinson (US) LLP

(57) ABSTRACT

According to one embodiment, an InRow liquid cooling module for a database center includes a main fluid distribution manifold and a mounting section. The manifold has a main supply line that is configured to receive coolant from a coolant source and a main return line that is configured to return warmed coolant to the coolant source. The mounting section is configured to receive cooling modules, each module is configured to 1) couple to the main supply line and the main return line to circulate the coolant through the module and 2) couple to a piece of IT equipment in an electronic rack to create a heat-transfer loop that transfers thermal energy away from the equipment and into the coolant that circulates through the module. In one embodiment, the InRow concept may be deployed as part of a data center infrastructure or combined as part of an electronic IT rack.

21 Claims, 6 Drawing Sheets

INROW LIQUID COOLING MODULE

FIELD

Embodiments of the present disclosure relate generally to an InRow liquid cooling module that cools IT equipment of an electronic rack in a database center.

BACKGROUND

Thermal management for a data center that includes several active electronic racks is critical to ensure proper performance of servers and other IT equipment that is operating in the racks. Without proper thermal management, however, the thermal environment (e.g., temperature) within the racks may exceed thermal operational thresholds, which may result in adverse consequences (e.g., servers failing, etc.). One way to manage the thermal environment is the use of a computer room air conditioning (CRAC) unit that is a device that monitors and maintains a data center's temperature.

Recently, data centers have been deploying more high-power density electronic racks, where more high-density chips are packaged closer together to provide more processing power. Cooling these high-density racks by maintaining a proper thermal environment may be an issue with existing cooling systems, such as a CRAC unit. For instance, although the CRAC unit may maintain the thermal environment with more conventional (or lower-density) racks, the unit may be unable to effectively cool high-power density racks because they may generate heat load at a higher rate due to the higher density electronics.

Liquid cooling, on the other hand, is a feasible solution for high-density electronic racks. For example, since liquid absorbs heat more efficiently than air, liquid cooling high-density racks may be implemented to maintain a thermal equilibrium. This type of cooling, however, has several disadvantages. For example, with any liquid cooling solutions there is a potential of failure and leakage which may cause damage to the IT equipment. Also, an electronic server rack may include different types and sizes of components, For instance, a rack may include servers (or server blades) of different sizes (e.g., 1U, 2U, 4U, etc.), each having different thermal requirements and specifications. Also, different equipment may have different types of liquid cooling solutions that coexist in one single electronic rack, such as single-phase water cooling, two-phase pumped liquid, etc.

Therefore, there is a need for a liquid cooling module that effectively and efficiently cools a high-density electronic rack. Specifically, the present disclosure describes a cooling module that provides a liquid cooling solution for supporting different types of liquid cooling IT equipment. As a result, the present disclosure provides a design that enables a data center to adjust the cooling capacity and solutions of the liquid cooling module based on the actual power load of the electronic rack. In addition, the liquid cooling module which is separate from the electronic rack reduces any potential leakage issues.

BRIEF DESCRIPTION OF THE DRAWINGS

The aspects are illustrated by way of example and not by way of limitation in the figures of the accompanying drawings in which like references indicate similar elements. It should be noted that references to "an" or "one" aspect of this disclosure are not necessarily to the same aspect, and they mean at least one. Also, in the interest of conciseness and reducing the total number of figures, a given figure may be used to illustrate the features of more than one aspect, and not all elements in the figure may be required for a given aspect.

DETAILED DESCRIPTION

Figure 1:
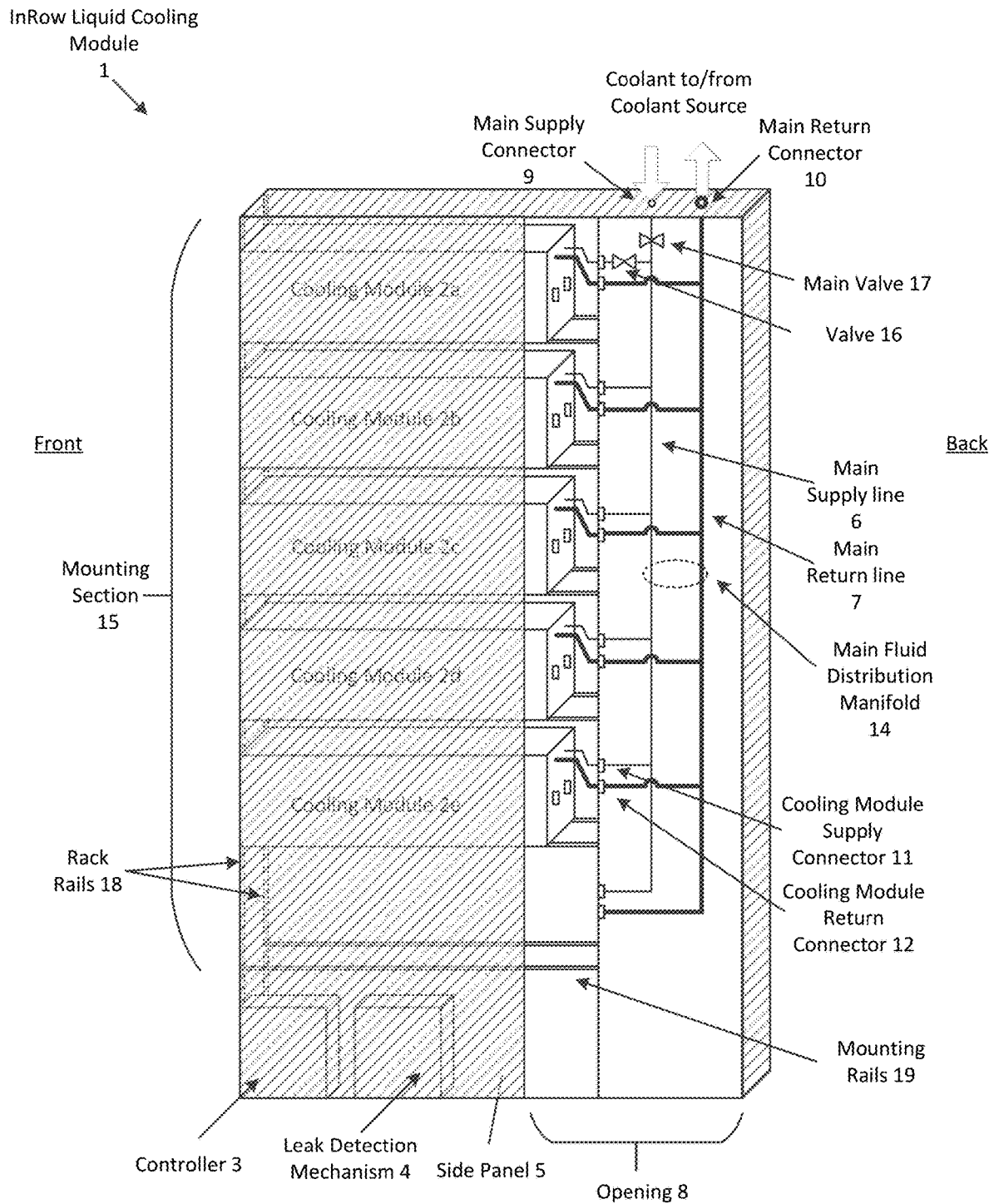
FIG. 1 is a block diagram illustrating an example of an InRow liquid cooling module according to one embodiment.

Several aspects of the disclosure with reference to the appended drawings are now explained. Whenever the shapes, relative positions and other aspects of the parts described in a given aspect are not explicitly defined, the scope of the disclosure here is not limited only to the parts shown, which are meant merely for the purpose of illustration. Also, while numerous details are set forth, it is understood that some aspects may be practiced without these details. In other instances, well-known circuits, structures, and techniques have not been shown in detail so as not to obscure the understanding of this description. Furthermore, unless the meaning is clearly to the contrary, all ranges set forth herein are deemed to be inclusive of the each range's endpoints.

Reference in the specification to "one embodiment" or "an embodiment" means that a particular feature, structure, or characteristic described in conjunction with the embodiment can be included in at least one embodiment of the disclosure. The appearances of the phrase "in one embodiment" in various places in the specification do not necessarily all refer to the same embodiment.

According to one embodiment, an InRow liquid cooling module for a data center includes a main fluid distribution manifold and a mounting section that is configured to receive cooling modules. The manifold has a main supply line that is configured to receive coolant from a coolant source and a main return line that is configured to return warmed coolant to the coolant source. Each cooling module is configured to 1) couple to the main supply line and to the main return line to circulate the coolant through the cooling module and 2) couple to a piece of IT equipment in an electronic rack via a supply line and a return line to create a heat-transfer loop that transfers thermal energy away from the piece of IT equipment and into the coolant that circulates through the module. The InRow cooling module is to be positioned adjacent to the electronic rack to provide liquid cooling to the IT equipment of the electronic rack.

In one embodiment, each of the cooling modules is one of a single-phase liquid-to-liquid heat exchanger and a two-phase liquid-to-liquid heat exchanger. In another embodiment, each cooling module is positioned higher than the piece of IT equipment in the electronic rack that is coupled to the cooling module to create a corresponding heat-transfer loop.

In some embodiments, a cooling module includes a fluid distribution manifold that is configured to couple to two or more pieces of IT equipment in order to create individual heat-transfer loops for each piece of IT equipment. In one embodiment, a cooling module is coupled to the main supply line and the main return line via a main supply connector and a main return connector, each of which is configured to removeably couple the cooling module to the main fluid distribution manifold.

In one embodiment, the InRow liquid cooling module further includes a main valve that is coupled to one of the main supply line and the main return line and is configured to allow the coolant to circulate through the InRow liquid cooling module. In another embodiment, the InRow liquid cooling module further includes a controller that is communicatively coupled to the main valve and is configured to change an opening ratio of the main valve to adjust a flow rate of coolant that circulates through the InRow liquid cooling module. In one embodiment, at least one cooling module is coupled to at least one of the main supply line and the main return line via a valve, where the controller is communicatively coupled to the valve and is configured to change an opening ratio of the valve to adjust a flow rate of the coolant that circulates through the cooling module.

In another embodiment, the InRow liquid cooling module further includes a leak detection mechanism that is configured to detect a coolant leak within the InRow liquid cooling module. In response to detecting a coolant leak within the main fluid distribution manifold, the leak detection mechanism is configured to instruct the controller to cause the main valve to close. In response, however, to detecting a coolant leak within the at least one cooling module, the leak detection mechanism is configured to instruct the controller to cause the valve to close.

According to another embodiment, a data center system includes an electronic rack and an InRow liquid cooling module. The electronic rack includes several pieces of IT equipment arranged in a first stack, at least one of the pieces includes one or more servers to provide data processing services. The InRow liquid cooling module is similar to the InRow liquid cooling module as previously described.

FIG. 1 is a block diagram illustrating an example of an InRow liquid cooling module according to one embodiment. Specifically, this figure shows an InRow Liquid Cooling Module 1 (hereafter referred to as InRow module) that is configured to be positioned adjacent to an electronic rack in a data center IT room to liquid cool components or pieces of IT equipment that are a part of the rack. In one aspect, the InRow module may have similar dimensions in terms of the depth and/or height to an electronic rack. As an example, the InRow module may have similar dimensions to a 42U rack, such as a height (H) of approximately 80 inches, a depth (D) of approximately 40 inches, and a width (W) of approximately 19 or 21 inches. In one embodiment, the InRow module may have different dimensions, such as having a reduced width in order to conserve rack space in the IT room.

As illustrated herein, the InRow module includes a main fluid distribution manifold 14 (hereafter referred to as main manifold 14), a mounting section 15, a controller 3, and a leak detection mechanism 4. In one embodiment, the InRow module may include more or less components. For instance, the InRow module may not include the leak detection mechanism.

The mounting section 15 is configured to receive one or more cooling modules 2. As illustrated, the mounting section 15 includes cooling modules 2a-2e that are each mounted within the section. The section also includes an empty space that is below the last module 2e that is configured to receive (at least one) additional cooling module. In one embodiment, the cooling modules may be any type of heat-exchanger, such as a single phase liquid-to-liquid heat exchanger, a two-phase liquid-to-liquid heat exchanger, etc. More about the types of cooling modules is described herein.

As illustrated, the mounting section 15 includes several rack rails 18 that are configured for mounting multiple electronic equipment modules, such as the cooling modules. The illustrated InRow module 1 is a 2-post rack having a pair of the rack rails 18, where one rack rail on the front left side of the module 1 and one rack rail on the front right side of the module 1. In one embodiment, the rack rails 18 may be positioned anywhere within the mounting section 15. In another embodiment, the module 1 may be a 4-post rack that has two pairs of rack rails 18. The rails 18 include holes (e.g., threaded holes) that may have any mounting-hole distance. In one embodiment, the rails 18 may have a mounting-hole distance that satisfies a standard rack specification, such as EIA-310 for a standard rack. In this figure, the five mounted cooling modules 2a-2e are mounted in the section 15 using a corresponding pair of mounting rails 19. In one embodiment, the mounting rails 19 are configured to be coupled (mounted) to the rack rails 18 via bolts (or fasteners) that are inserted into the holes of the rails. As a result, a vertical position of the mounting rails (and therefore the cooling modules) upon the rack rails 18 may be adjusted (e.g., by a technician) to accommodate different sized modules. For instance, the mounting rails 19 may be adjusted to accommodate 1U, 2U, 4U, etc. cooling modules. In one embodiment, the mounting rails 19 may be sliding mounting rails in order to enable a technician easy access to the module. In another embodiment, the mounting section 15 may include any mechanism that enables the mounting of one or more cooling modules.

The main manifold 14 is configured to circulate coolant from a coolant source through one or more cooling modules that are mounted within the mounting section 15 of the InRow module 1, thereby creating a heat-exchanging loop. Specifically, the main manifold has a main supply line 6 that is configured to receive (e.g., cold) coolant from the coolant source and a main return line 7 that is configured to return (e.g., warmed) coolant to the coolant source that is warmed by one or more cooling modules, as described herein. Thus, each of the cooling modules 2 is configured to couple to the main supply line 6 and the main return line 7 to circulate coolant through the cooling module. In one embodiment, a heat-exchanging loop between a cooling module (e.g., 2a), the InRow module 1, and a coolant source, such as a data center cooling water system or an IT liquid cooling water system (not shown), may be referred to as a primary loop or a liquid cooling loop. Thus, when there are multiple cooling modules, there is a primary loop for each cooling module, where each of the cooling modules share the coolant that flows through the main supply line 6. In one embodiment, multiple InRow modules may be coupled to the coolant source, as described herein.

In one embodiment, the main manifold is removeably coupled to the coolant source (not shown) via connectors. In particular, the module 1 includes a main supply connector 9 that removeably couples the main supply line 6 to a separate supply line (not shown) that is coupled to the coolant source, and the module 1 includes a main return connector 10 that removeably couples the main return line 7 to a separate return line (not shown) that is coupled to the coolant source. Thus, the connectors enable the InRow module 1 to be coupled to the coolant source (e.g., to enable a creation of one or more primary loops based on the number of cooling modules mounted in the InRow module), and enable the InRow module 1 to be disconnected from the coolant source, resulting in removal of any primary loops. In one embodiment, the connectors may be dripless blind mating quick disconnects. In another embodiment, the connectors may be any type of connector that enables a technician to couple supply/return lines to the module 1. As a result, the InRow module 1 may be positioned anywhere in a data center IT room that includes supply and return lines that are coupled to a separate coolant source.

The main manifold 14 also includes several pairs of cooling module connectors. In particular, the InRow module 1 includes six pairs of connectors, each pair including a cooling module supply connector 11 that is configured to removeably couple a cooling module to the main supply line 6, and a cooling module return connector 12 that is configured to removeably couple the cooling module to the main return line 7. In one embodiment, the pair of connectors enable a cooling module to couple to the main manifold 14 via lines (e.g., separate supply and return lines) that couple to the cooling module and to a respective connector. As a result, when a cooling module 2 is coupled to the connectors 11 and 12, the cooling module is a part of the primary loop, whereby coolant that circulates within the main manifold 14 may circulate through the cooling module. In one embodiment, the main manifold 14 may include more or less pairs of connectors that are positioned at different (or similar) locations about the main manifold 14. For example, the InRow module 1 may include forty-two pairs of connectors when the InRow module is a 42U module. In another embodiment, each pair of connectors may be repositioned within the main manifold in order to accommodate different sizes and amounts of cooling modules that are mounted within the mounting section 15.

The main manifold 14 also includes a main valve 17 that is coupled to the main supply line 6 and is configured to allow the coolant to circulate through the (main manifold 14 of the) InRow module 1. Specifically, the main valve 17 is coupled between the main supply line 6 and the main supply connector 9. In one embodiment, in addition to (or in lieu of) the main valve being coupled to the main supply line 6, there may be another main valve coupled to the main return line. In another embodiment, there may be multiple main valves within the main manifold.

The main manifold 14 also includes a valve 16 that is coupled between the cooling module supply connector 11 for cooling module 2a and the main supply line 6. Thus, the cooling module 2a is coupled to the main supply line 6 via the valve 16. The valve 16 is configured to allow coolant to circulate through the cooling module 2a. In one embodiment, there may be such a valve for each pair of cooling module connectors 11 and 12. For example, each cooling module supply connector 11 of the six illustrated pairs of cooling module connectors may be coupled to the main supply line 6 via a valve. In another embodiment, in addition to (or in lieu of) the valve 16, there may be a valve coupled between the cooling module return connector 12 and the main return line 7.

As described herein, the InRow module 1 also includes a controller 3 and leak detection mechanism 4. As illustrated, these components are positioned below the mounting section 15. In another embodiment, however, these components may be mounted within the mounting section 15. Thus, the mounting section 15 may extend from top to bottom of the InRow module 1. In another embodiment, the controller and/or leak detection mechanism may be positioned anywhere within the InRow module 1. In some embodiments, either of these components may be located separate from the InRow module and may be communicatively coupled (e.g., wired or wireless) to the InRow module 1. Although the leak detection mechanism 4 is illustrated as being separate from the controller 3, in one embodiment the controller 3 may perform leak detection operations as described herein.

The leak detection mechanism 4 is configured to detect coolant leaks within the InRow module 1. In particular, the mechanism 4 may include a liquid sensor that is configured to detect the presence of liquid. For example, the sensor may measure electrical conductivity, where a liquid such as coolant may complete an open circuit within the sensor. In one embodiment, there may be one or more liquid sensors within the InRow module 1, with which the leak detection mechanism 4 is in communicatively coupled (e.g., wired or wireless). For example, liquid sensors may be positioned throughout the main manifold 14 and/or the mounting section 15. As another example, there may be a liquid sensor within a close proximity to each valve (e.g., main valve 17 and/or valve 16).

The controller 3 may be a special-purpose processor such as an application-specific integrated circuit (ASIC), a general purpose microprocessor, a field-programmable gate array (FPGA), a digital signal controller, or a set of hardware logic structures (e.g., filters, arithmetic logic units, and dedicated state machines). In one embodiment, the controller may be a circuit with a combination of analog elements (e.g., resistors, capacitors, inductors, etc.) and/or digital elements (e.g., logic-based elements, such as transistors, etc.). The controller may also include memory.

In one embodiment, the controller 3 is communicatively coupled (e.g., wired and/or wirelessly connected) with at least some of the valves (e.g., main valve 17 and/or valve(s) 16) and is configured to control the valves (e.g., by transmitting a control signal to control circuitry of the valve, such as an electronic switch) in order to cause the valve to open and/or close. For instance, the controller may cause a valve to close based on a detection of a coolant leak by the leak detection mechanism 4. As an example, the leak detection mechanism 4 may detect a coolant leak in the main manifold 14. In response to detecting the coolant leak within the main manifold, the mechanism may transmit an instruction (or indication) to the controller 3, instructing the controller to cause the main valve 17 to close. The controller may then transmit a control signal to the main valve 17, causing it to close.

Similarly, the controller 3 may control valve 16 based on a leak detection at or near the cooling module 2a. For example, the leak detection mechanism 4 may detect a coolant leak near cooling module 2a (e.g., at one of the cooling module connectors 11 and 12 that couple the cooling module 2a to the main manifold 14, within the mounting section 15, etc.). In one embodiment, the cooling module 2a may include a separate internal leak detection mechanism that may detect a leaking within the cooling module. As a result, the internal leak detection mechanism of the cooling module 2a may transmit an indication to the leak detection mechanism 4 (and/or the controller 3) of a leak in the cooling module 2a. In response to detecting a coolant leak within (or near) the cooling module 2a, the leak detection mechanism may transmit an instruction to the controller 3, instructing the controller to cause the valve 16 to close. Thus the controller 3 may mitigate leaks within the InRow module 1. For example, by closing valve 16, the other cooling modules 2b-2e may continue to circulate coolant. If, however, a leak is detected within the main manifold 14, the InRow module may cease circulating coolant within the entire module in order to mitigate any future potential leaking.

In one embodiment, the controller 3 is configured to balance the flow of coolant that circulates within and throughout the InRow module 1. Specifically, the InRow module 1 may include one or more flow sensors that are configured to detect the (instant) flow rate of coolant that is circulating through the main manifold 14. In one embodiment, the flow of coolant within the main manifold may be dependent upon a type of cooling module that is coupled to the main manifold 14. For instance, some cooling modules may require a higher flow rate than other cooling modules, or a bigger cooling module may require more coolant to circulate than a smaller module. In one embodiment, the cooling modules may include internal flow sensors. In another embodiment, there may be a flow sensor that is coupled between the main supply line 6 (and/or the main return line 7) and at least some cooling module supply connectors 11 (and/or at least some cooling module return connectors 12). The controller 3 may be communicatively coupled to the flow sensors and configured to receive an indication of the flow rate, which may be the flow rate of coolant 1) through the main manifold 14 and/or 2) through the cooling module(s). The controller may compare the (current) flow rate to a threshold flow rate. In response to the current flow rate being below the threshold, the controller is configured to change an opening ratio of one or more valves within the InRow module 1. For example, the controller may determine that the flow rate through the main manifold is below a (first) threshold, and in response change an opening ratio of the main valve 17 to adjust a flow rate (e.g., increase the flow rate) of the coolant that circulates through the InRow module. As another example, the controller may determine that the flow rate through a cooling module (e.g., cooling module 2a) is below a (second) threshold, and in response change an opening ratio of valve 16 to adjust a flow rate of coolant that circulates through the cooling module 2a. In one embodiment, the threshold flow rate for the main manifold 14 and/or the cooling modules may be the same or different.

In one embodiment, the InRow module is configured to allow access to the main manifold and/or a portion of the mounting section 15 (e.g., when the InRow module is adjacent to an electronic rack in a data center IT room). Specifically, the InRow module 1 includes a side panel 5 that covers at least a portion of the mounting section 15 and includes an opening 8 that allows a technician access to a remainder of the InRow module. Thus, working through the opening 8 a technician may add a cooling module 2 to the mounting section 15 from the front and couple the cooling module to a pair of corresponding cooling module connectors 11 and 12 (via separate supply and return lines) in order to create an individual primary loop if the connectors require manual operation. The opening 8 also enables for a cooling module to be coupled to a piece of IT equipment of an electronic rack in order to create a heat-exchanging loop between the piece of equipment and the cooling module that transfers thermal energy away from the piece of IT equipment and into the coolant that circulates through the module. This loop may hereafter be referred to as a secondary loop that transfers heat away from the piece of IT equipment, and into the coolant that circulates within the primary loop. In one embodiment, the primary and second loops may be separate (e.g., not sharing coolant), or the loops may be connected (e.g., by sharing the coolant that circulates through the main manifold 14).

Figure 2A:
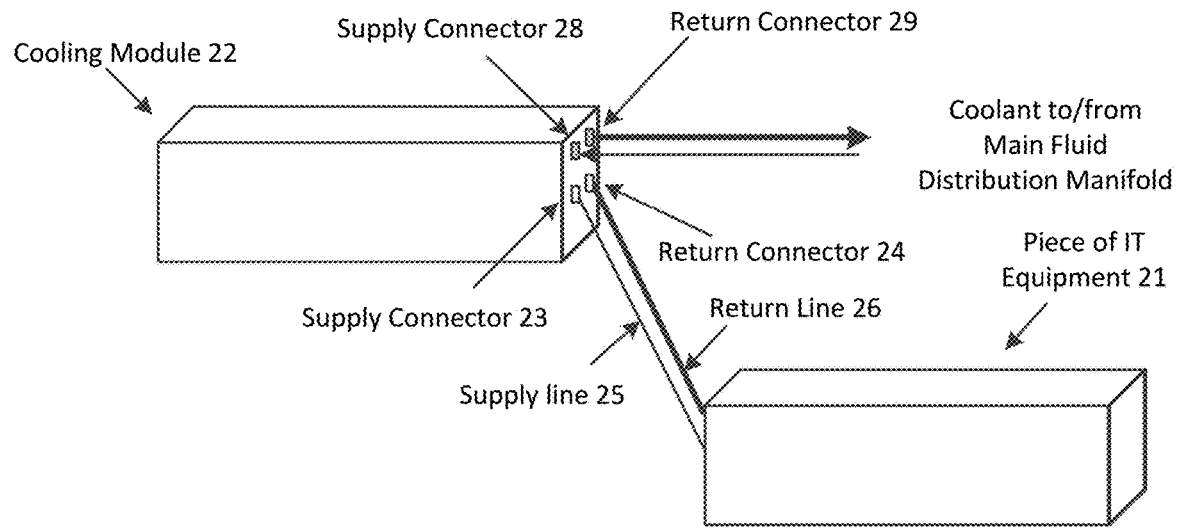
FIGS. 2a and 2b are block diagrams illustrating examples of cooling modules of the InRow liquid cooling module according to one embodiment.
Figure 2B:
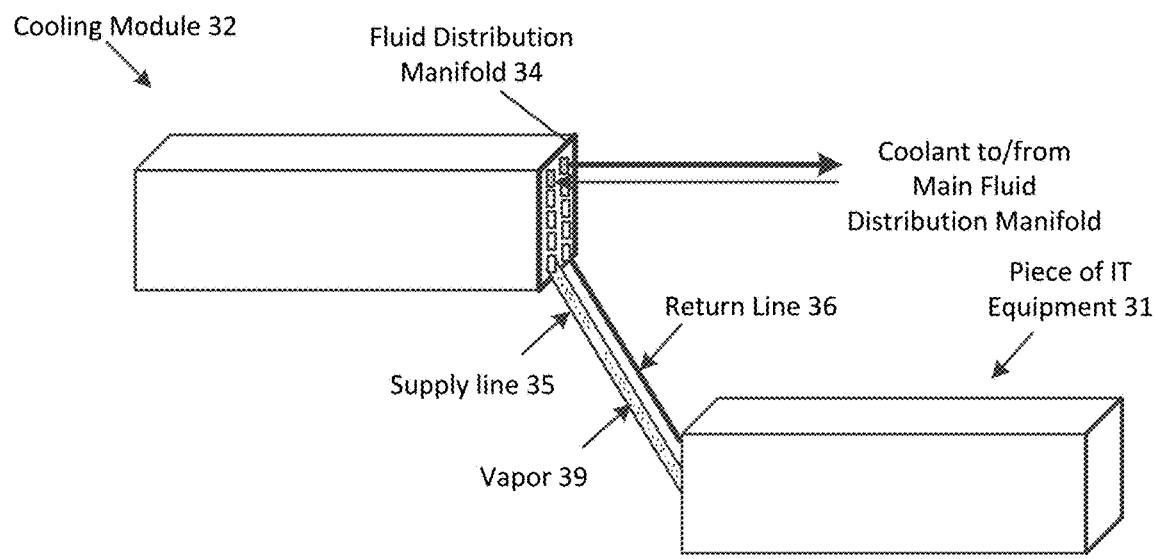

FIGS. 2a and 2b are block diagrams illustrating examples of cooling modules of the InRow liquid cooling module according to one embodiment. Specifically, these figures illustrate two cooling modules that are each coupled to a respective piece of IT equipment in order to create a secondary heat-transfer loop that is for drawing thermal energy away from the piece of equipment. Although both figures illustrate just a cooling module and piece of IT equipment, in one embodiment the cooling module(s) may be mounted within (e.g., the mounting section 15) of the InRow module 1 and the piece(s) of IT equipment may be mounted within an electronic rack, such as rack 500 illustrated in FIG. 5.

FIG. 2a illustrates cooling module 22 that is a single-phase liquid-to-liquid heat exchanger that is coupled to a piece of IT equipment 21. The cooling module 22 includes two pairs of supply connectors. A first pair of supply connectors (e.g., supply connector 28 and return connector 29) are configured to removeably couple the cooling module 22 to the main manifold 14 of the InRow module 1. In particular, a first end of a supply line and a first end of a return line may be coupled to the cooling module 22, via a respective connector, and a second end of the supply line and a second end of the return line may be coupled to a pair of cooling module connectors (e.g., the cooling module supply connector 11 and the cooling module return connector 12) of the main manifold 14. A second pair of supply connectors (e.g., supply connector 23 and return connector 24) are configured to removeably couple the cooling module 22 to the piece of IT equipment 21. Specifically, a first end of the supply line 25 is coupled to the supply connector 23 and a first end of the return line 26 is coupled to the return connector 24, while a second end of the supply line 25 and the return line 26 are coupled to the piece of IT equipment 21. In one embodiment, the piece of IT equipment 21 may include a pair of connectors that allow the supply and return lines to be removeably coupled.

As described herein, the cooling module 22 and the piece of IT equipment 21 create a secondary loop in which fluid (e.g., coolant) is circulated in order to draw thermal energy away from the piece of IT equipment 21. Thus, the cooling module 22 supplies cooled fluid through the supply line 25 and receives warmed coolant through the return line 26. The cooling module 22 transfers thermal energy from the warmed coolant into cooler coolant that is being circulated between the cooling module 22 and the InRow module 1, as described herein.

FIG. 2b illustrates cooling module 32 that is a two-phase liquid-to-liquid heat exchanger that is coupled to a piece of IT equipment 31. The cooling module 32 includes a fluid distribution manifold 34 that is configured to allow the cooling module 32 to be coupled to several (e.g., one or more) pieces of IT equipment 31. Thus, the cooling module 32 may couple to several pieces of IT equipment to create individual secondary loops for each piece of IT equipment in order to draw away thermal energy that is generated by the pieces of equipment. Specifically, the fluid distribution manifold 34 includes five pairs of connectors. A first (or top) pair of connectors may be similar to connectors 28 and 29 and are configured to couple the cooling module 32 to the InRow module 1, as described herein. The other four pairs of connectors (below the top pair) may be similar to connectors 23 and 24 and are configured to removeably couple up to four pieces of IT equipment to the cooling module 32 in order to create four different secondary loops. In one embodiment, the manifold may include more (or less) pairs of connectors. As illustrated, however, only a single piece of IT equipment 31 is coupled to the cooling module 32 via a supply line 35 and a return line 36.

As described herein, the cooling module 32 is a two-phase liquid-to-liquid heat exchanger. Thus, when coupled to the piece of IT equipment 31 and a secondary loop is created, and vapor 39 may travel through the supply line 35 into the cooling module 32. The module may include a condenser chamber that includes a condenser that is coupled to the main manifold 14 (via the fluid distribution manifold 34) to circulate coolant. The vapor enters the condenser chamber, where the condenser condenses the vapor into cooled liquid that is then circulated back into the piece of equipment 31 via the return line 36.

In one embodiment, the fluid distribution manifold 34 enables the heat exchanging process to be performed for each piece of IT equipment that is coupled to a pair of connectors of the fluid distribution manifold 34. For example, the fluid distribution manifold 34 enables vapor 39 from each piece of IT equipment that is coupled to the manifold 34 to be condensed by the same (or a separate) condenser within the cooling module 32 into cooled liquid, which is then circulated back into a respective piece of equipment. In another embodiment, a single-phase liquid-to-liquid heat exchanger, such as cooling module 22 may include a same or similar fluid distribution manifold, as described herein.

In one embodiment, each of the connectors described herein, may be dripless blind mating quick disconnects, or any type of connector, as described herein. In another embodiment, although not illustrated, a pump may be coupled between the cooling module 32 and the piece of IT equipment 31. Specifically, a pump may be coupled between the return line 36 and the cooling module 32 (or the piece of IT equipment 31) to push the cooled liquid from the cooling module 32 into the piece of IT equipment 31. Similarly, there may be a pump coupled between the cooling module 22 and the piece of IT equipment 21 in order to circulate cooling through the secondary loop.

Figure 3:
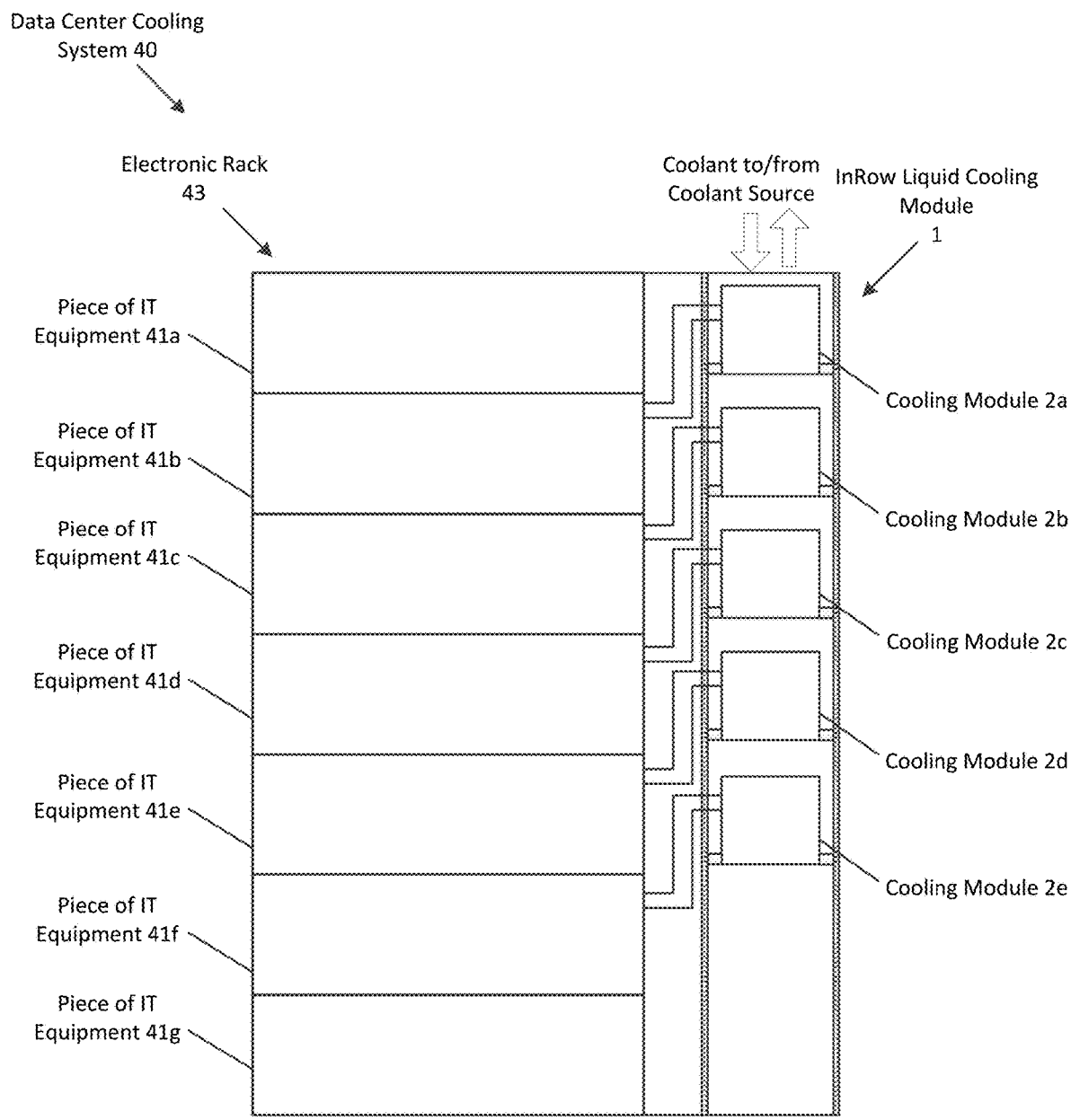
FIG. 3 is a block diagram illustrating a data center cooling system according to one embodiment.

FIG. 3 illustrates a block diagram showing a data center cooling system according to one embodiment. Specifically, this figure shows a data center cooling system 40 that includes a front view of an electronic rack 43 that is adjacent to the InRow module 1. As illustrated, the electronic rack 43 includes several pieces of IT equipment 41a-41g that are arranged in a (first) stack, and the InRow module 1 includes the five cooling modules 2a-2e that are arranged in a (second) stack. In this example, each of the cooling modules is positioned higher than the piece of IT equipment in the electronic rack that is coupled to the cooling module in order to create a corresponding heat-transfer loop (or secondary loop). For instance, cooling module 2a is coupled (via a supply line and a return line) to IT equipment 41b. In one embodiment, the cooling modules may always be positioned higher than the piece of equipment that which the module is coupled. This arrangement may enable circulation of a heat-transfer loop of any type of cooling module, such as a two-phase liquid-to-liquid heat exchanger that receives vapor that is created by the piece of IT equipment. In one embodiment, at least one of the cooling modules may be coupled to multiple pieces of IT equipment via the fluid distribution manifold 34.

This system enables the electronic rack 43 to use hybrid cooling methods. For example, some pieces of IT equipment may be liquid cooled, while some may be air cooled. This figure illustrates such an electronic rack. For instance, equipment 41a and 41g are not coupled to any cooling module and may be air cooled, while the other pieces of IT equipment are liquid cooled via cooling modules 2a-2e, or are partially liquid cooled and partially air cooled.

Figure 4A:
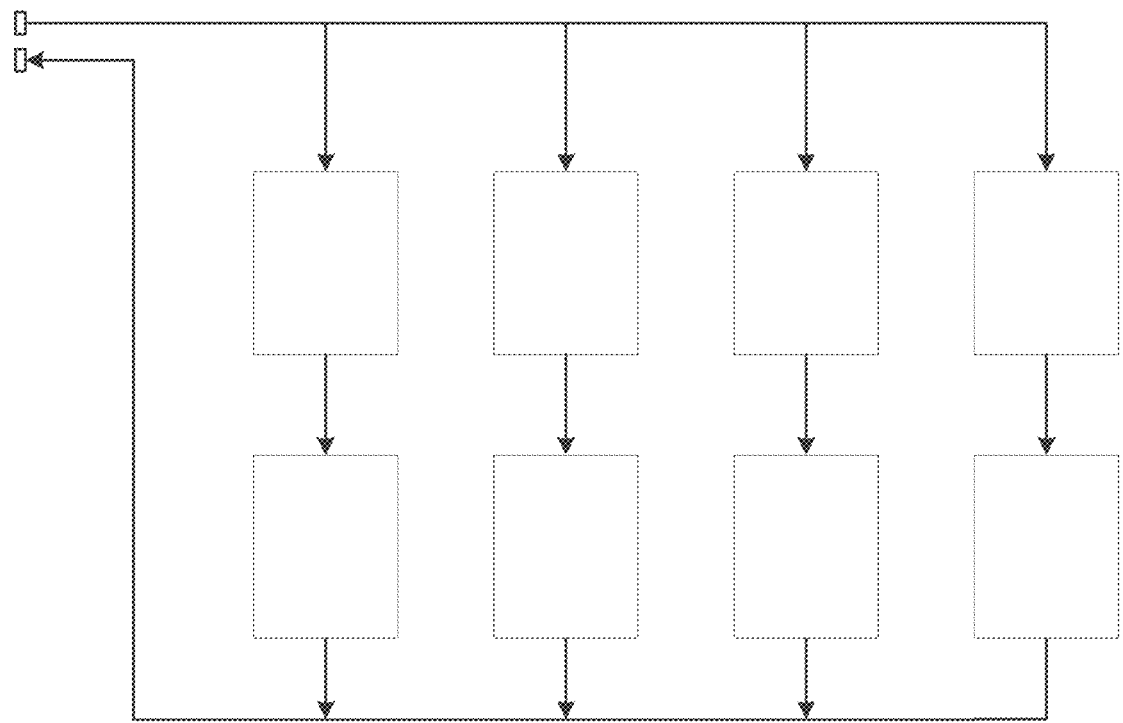
FIGS. 4a and 4b are block diagrams illustrating examples of different types of phase cooling of IT equipment of an electronic rack according to one embodiment.
Figure 4B:
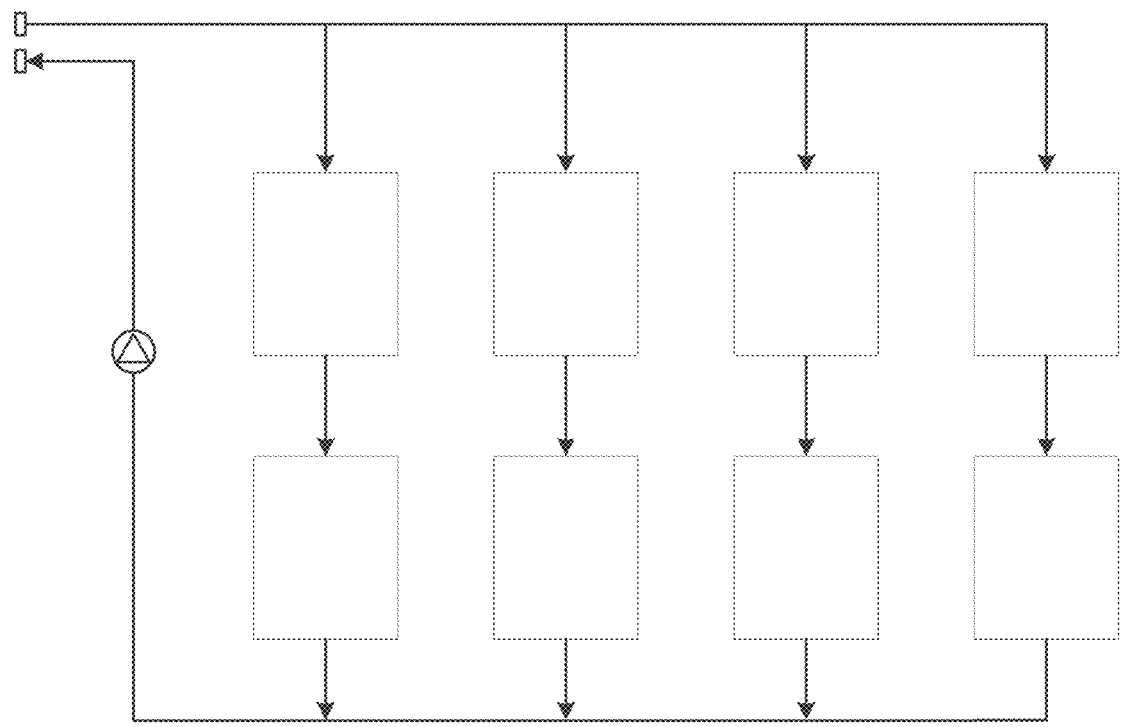

FIGS. 4a and 4b are block diagrams illustrating examples of different types of phase cooling of IT equipment of an electronic rack according to one embodiment. In particular, these figures illustrate cooling loops within an electronic rack (and/or a piece of IT equipment within a rack). For example, FIG. 4a shows a two-phase cooling loop and FIG. 4b shows a single-phase cooling loop. Each loop includes a pair of connectors that may be coupled to a cooling module and includes four separate cooling loops that are in parallel with the pair of connectors, where each separate cooling loop includes two cold plates that are in series with one another. In one embodiment, each of the cold plates may be coupled to (at least one component) of a piece of IT equipment. For instance, this loop may be within one piece of IT equipment or may span two or more pieces of IT equipment. The two phase cooling loop of FIG. 4a supplies coolant (which is received by a cooling module) to the first row of cold plates. Each of these cold plates converts at least some of the coolant into vapor, and supplies vapor and coolant to the next cold plate that is in series. The second cold plate converts more of the coolant into vapor. The vapor is then transmitted into the cooling module, which condenses the vapor into cooled liquid, as described herein. Similarly, the single-phase cooling loop of FIG. 4b supplies coolant to the first row of cold plates. Each of these plates transfers heat into the coolant, which is then supplied to the next cold plate that is in series. The second cold plate transfers more heat into the coolant. The cooling loop of FIG. 4b includes a pump that is configured to draw the warmed coolant from the loop and push it into a cooling module that is coupled to the loop.

Figure 5:
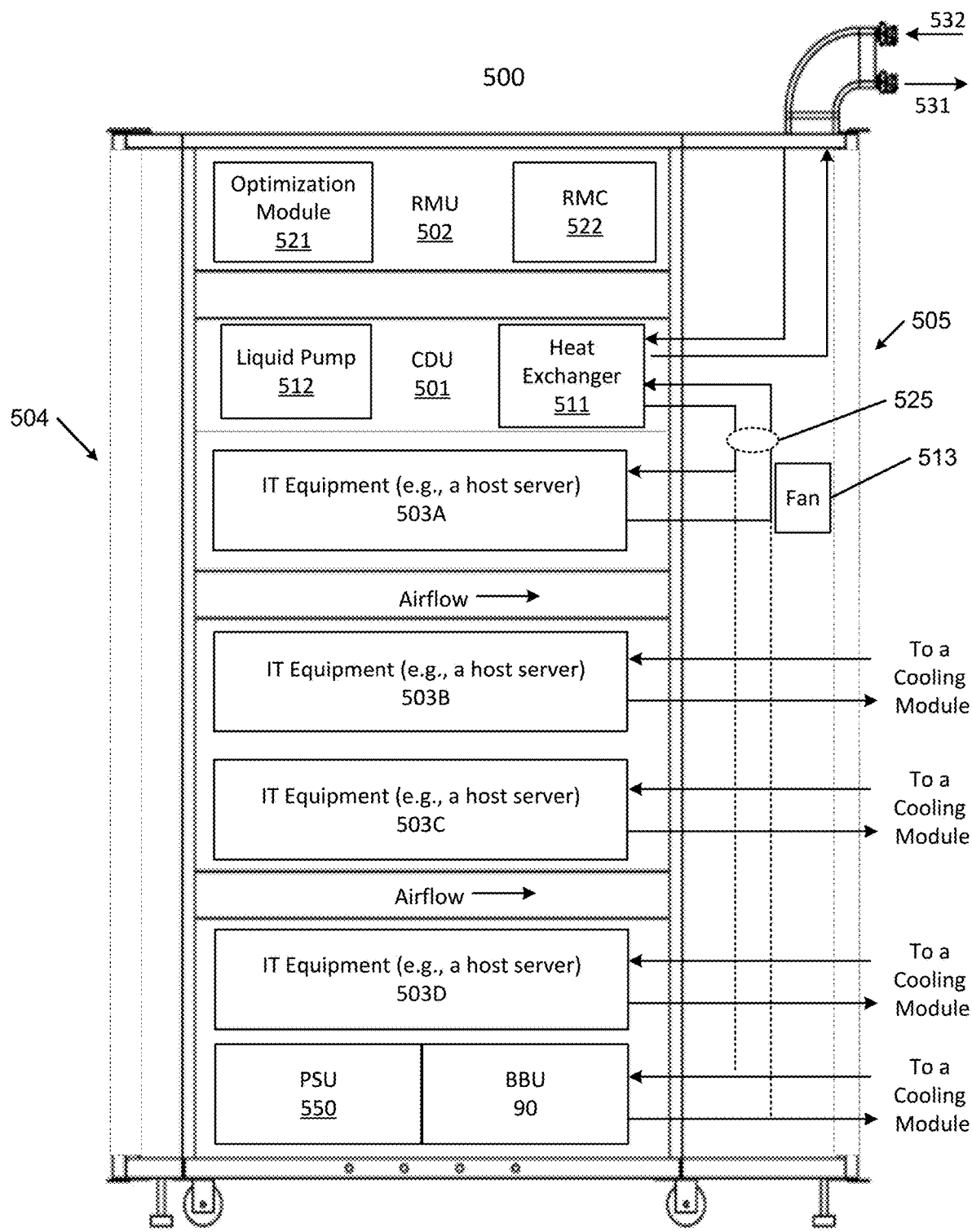
FIG. 5 shows an example of an electronic rack according to one embodiment.

FIG. 5 is a block diagram illustrating an example of an electronic rack according to one embodiment. Electronic rack 500 may include one or more server slots to contain one or more servers respectively. Each server includes one or more information technology (IT) components (e.g., processors, memory, storage devices, network interfaces). According to one embodiment, electronic rack 500 includes, but is not limited to, CDU 501, rack management unit (RMU) 502 (optional), a power supply unit (PSU) 550, a battery backup unit (BBU) 90, and one or more pieces of IT equipment 503A-503D, which may be any type of IT equipment, such as server blades. The equipment 503 can be inserted into an array of server slots respectively from frontend 504 or backend 505 of electronic rack 500. The PSU 550 and/or BBU 90 may be inserted into any of server slots 503 within the electronic rack 500.

Note that although there are only four pieces of IT equipment 503A-503D shown here, more or fewer pieces of IT equipment may be maintained within electronic rack 500. Also note that the particular positions of CDU 501, RMU 502, PSU 550, BBU 90, and IT equipment 503 are shown for the purpose of illustration only; other arrangements or configurations of these components may also be implemented. Note that electronic rack 500 can be either open to the environment or partially contained by a rack container, as long as the cooling fans can generate airflows from the frontend to the backend.

In addition, a fan module can be associated with at least one of the pieces of IT equipment. In this embodiment, fan module 513 may include one or more cooling fans and may be mounted on the backend of the IT equipment 503A to generate airflow flowing from frontend 504, traveling through the air space of the equipment, and existing at backend 505 of electronic rack 500. In one embodiment, the fan module 513 may be mounted on the front end 504. In another embodiment, a fan module may be mounted on the backend of at least some of the other IT equipment, such as 503B.

In one embodiment, CDU 501 mainly includes heat exchanger 511, liquid pump 512, and a pump controller (not shown), and some other components such as a liquid reservoir, a power supply, monitoring sensors and so on. Heat exchanger 511 may be a liquid-to-liquid heat exchanger. Heat exchanger 511 includes a first loop with inlet and outlet ports having a first pair of liquid connectors coupled to external liquid supply/return lines 531-532 to form a primary loop. The connectors coupled to the external liquid supply/return lines 531-532 may be disposed or mounted on backend 505 of electronic rack 500. The liquid supply/return lines 531-532 are coupled to a set of room manifolds, which are coupled to an external heat removal system, or external cooling loop. In addition, heat exchanger 511 further includes a second loop with two ports having a second pair of liquid connectors coupled to liquid manifold 525 to form a secondary loop, which may include a supply manifold to supply cooling liquid to the piece of IT equipment 503A and a return manifold to return warmer liquid back to CDU 501. In one embodiment, more pieces of IT equipment may form secondary loops with the heat exchanger 511. In other embodiment, none of the IT equipment may form such loops. Note that CDUs 501 can be any kind of CDUs commercially available or customized ones. Thus, the details of CDUs 501 will not be described herein.

The other pieces of IT equipment 503B-503D and the PSU/BBU, on the other hand, may each couple to a cooling module to each form a secondary loop, as described herein. For instance, each of the pieces of equipment may couple to a separate cooling module. As another example, two or more of the pieces of IT equipment may couple to a single cooling module via a fluid distribution manifold, as described herein. In one embodiment, none of the pieces of IT equipment may form a secondary loop with an internal heat exchanger (e.g., 511) within the rack 500, but instead form the secondary loops with cooling modules that are mounted within one or more InRow modules, such as module 1. As a result, the rack 500 may not include the liquid pump 512, the CDU 501, the heat exchanger 511, nor the manifold 525.

Each of the pieces of IT equipment 503 may include one or more IT components (e.g., central processing units or CPUs, graphical processing units (GPUs), memory, and/or storage devices). Each IT component may perform data processing tasks, where the IT component may include software installed in a storage device, loaded into the memory, and executed by one or more processors to perform the data processing tasks. At least some of these IT components may be attached to the bottom of any of the cooling devices as described above. IT equipment 503 may include a host server (referred to as a host node) coupled to one or more compute servers (also referred to as computing nodes, such as CPU server and GPU server). The host server (having one or more CPUs) typically interfaces with clients over a network (e.g., Internet) to receive a request for a particular service such as storage services (e.g., cloud-based storage services such as backup and/or restoration), executing an application to perform certain operations (e.g., image processing, deep data learning algorithms or modeling, etc., as a part of a software-as-a-service or SaaS platform). In response to the request, the host server distributes the tasks to one or more of the performance computing nodes or compute servers (having one or more GPUs) managed by the host server. The performance compute servers perform the actual tasks, which may generate heat during the operations.

Electronic rack 500 further includes optional RMU 502 configured to provide and manage power supplied to equipment 503, fan module 513, and/or CDU 501. Optimization module 521 and RMC 522 can communicate with a controller in some of the applications. RMU 502 may be coupled to PSU 550 to manage the power consumption of the PSU. The PSU 550 may include the necessary circuitry (e.g., an alternating current (AC) to direct current (DC) or DC to DC power converter, backup battery, transformer, or regulator, etc.,) to provide power to the rest of the components of electronic rack 500.

In one embodiment, RMU 502 includes optimization module 521 and rack management controller (RMC) 522. RMC 522 may include a monitor to monitor operating status of various components within electronic rack 500, such as, for example, the equipment 503, CDU 501, and fan module(s) 513. Specifically, the monitor receives operating data from various sensors representing the operating environments of electronic rack 500. For example, the monitor may receive operating data representing temperatures of the processors, cooling liquid, and airflows, which may be captured and collected via various temperature sensors. The monitor may also receive data representing the fan power and pump power generated by the fan module 513 and liquid pump 512, which may be proportional to their respective speeds. These operating data are referred to as real-time operating data. Note that the monitor may be implemented as a separate module within RMU 502.

Based on the operating data, optimization module 521 performs an optimization using a predetermined optimization function or optimization model to derive a set of optimal fan speeds for fan module 513 and an optimal pump speed for liquid pump 512, such that the total power consumption of liquid pump 512 and fan module 513 reaches minimum, while the operating data associated with liquid pump 512 and cooling fans of fan modules 513 are within their respective designed specifications. Once the optimal pump speed and optimal fan speeds have been determined, RMC 522 configures liquid pump 512 and cooling fans of fan module 513 based on the optimal pump speed and fan speeds.

As an example, based on the optimal pump speed, RMC 522 communicates with a pump controller of CDU 501 to control the speed of liquid pump 512, which in turn controls a liquid flow rate of cooling liquid supplied to the liquid manifold 525 to be distributed to equipment that is coupled to the manifold 525. Therefore, the operating condition and the corresponding cooling device performance are adjusted. Similarly, based on the optimal fan speeds, RMC 522 communicates with each of the fan module 513 to control the speed of each cooling fan of the fan module 513, which in turn control the airflow rates of the fan module 513. Note that each of fan module 513 may be individually controlled with its specific optimal fan speed, and different fan modules and/or different cooling fans within the same fan module may have different optimal fan speeds.

In one embodiment, the BBU 90 may be configured to provide battery backup power to the electronic rack (e.g., to one or more pieces of IT equipment 503A-503D) when the (main) power supply is unavailable (e.g., a power outage).

Note that some or all of the IT equipment (e.g., 903A, 903B, 903C, and/or 903D) may be attached to any one of the cooling devices described above, either via air cooling using a heatsink or via liquid cooling using a cold plate. One server may utilize air cooling while another server may utilize liquid cooling. Alternatively, one IT component of a server may utilize air cooling while another IT component of the same server may utilize liquid cooling. In addition, a switch is not shown here, which can be either air cooled or liquid cooled. In one embodiment, the location of the equipment or components of the electronic rack, such as the PSU and BBU may be varied, and may not be exactly as shown in this figure.

Figure 6:
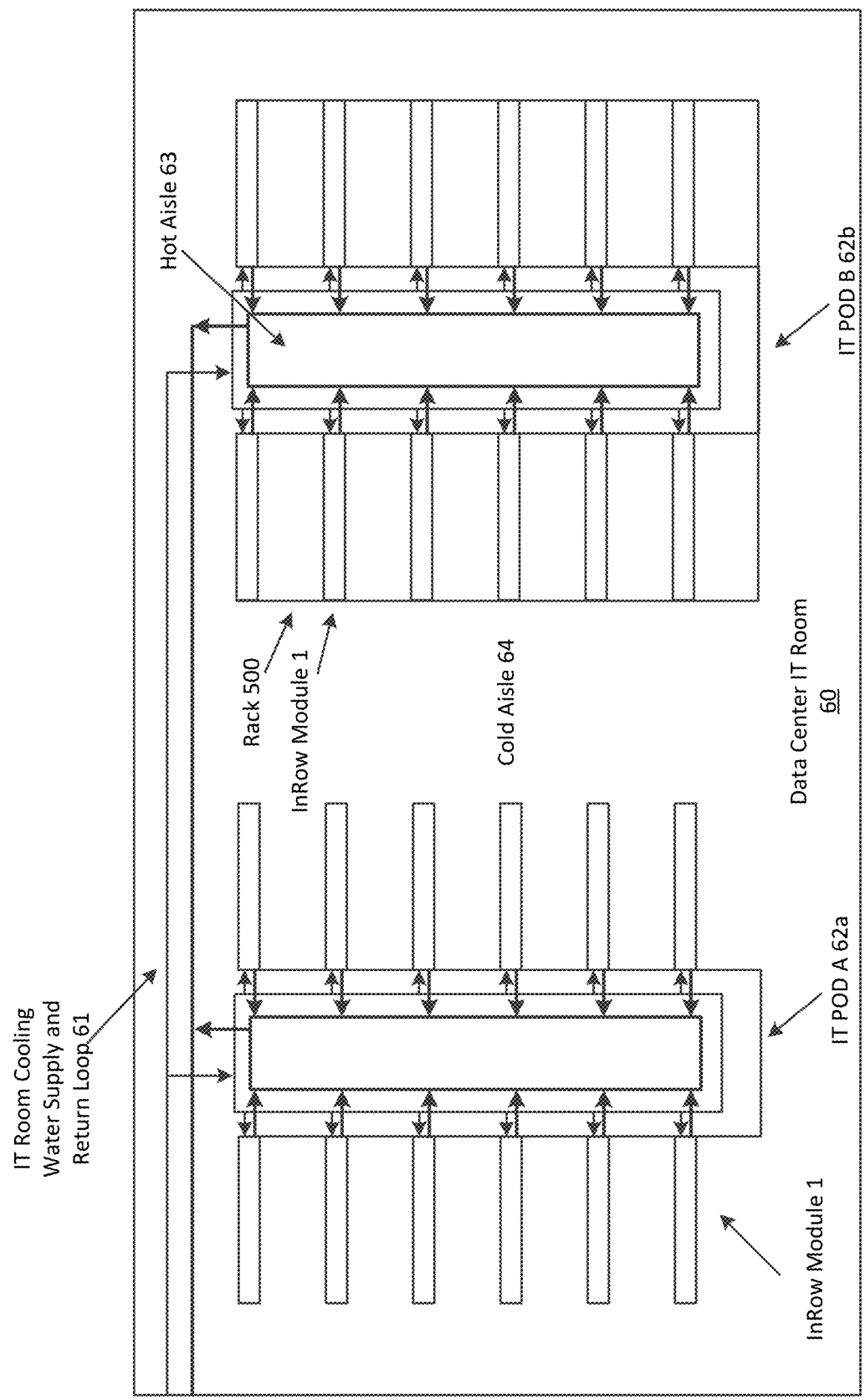
FIG. 6 shows an example of an IT room in a data center with installed InRow liquid cooling modules.

FIG. 6 shows an example of an IT room in a data center with installed InRow liquid cooling modules. Specifically, this figure illustrates a data center IT room 60 with two IT PODs, POD A 62a and POD B 62b, and an IT room cooling water and return loop 61. Each POD is surrounded by a cold aisle 64, and has a hot aisle 63 in the middle of the POD. Thus, components that are populated within a POD that are air cooled may draw cool air from the cold aisle 64 in order to transfer heat generated by the components to the drawn air, thereby producing warmed air that is pushed into the hot aisle 63. Warmed air in the hot aisle 63 may be air conditioned using any type of data center air condition unit and may be circulated back into the cold aisle 64.

Both IT PODs are populated with twelve InRow modules 1, where each InRow module 1 is coupled to the IT room cooling water supply and return loop 61. IT POD B 62b is also populated with twelve electronic racks 500, where the racks and the InRow modules 1 are staggered between one another. The InRow modules may be staggered with the electronic racks in order to ensure that at least one InRow module is adjacent to each electronic rack. Arranging the InRow modules and electronic racks in this fashion, ensures that IT equipment in each rack has access to cooling modules mounted in the InRow modules. Unlike IT POD B 62b, IT POD A 62a is only populated with InRow Modules 1. This enables a data center to populate a POD with InRow modules prior to installation of the electronic racks, and the InRow modules can be commissioned together with data center liquid cooling infrastructure.

In the foregoing specification, embodiments of the disclosure have been described with reference to specific exemplary embodiments thereof. It will be evident that various modifications may be made thereto without departing from the broader spirit and scope of the disclosure as set forth in the following claims. The specification and drawings are, accordingly, to be regarded in an illustrative sense rather than a restrictive sense.

In the foregoing specification, embodiments of the disclosure have been described with reference to specific exemplary embodiments thereof. It will be evident that various modifications may be made thereto without departing from the broader spirit and scope of the disclosure as set forth in the following claims. The specification and drawings are, accordingly, to be regarded in an illustrative sense rather than a restrictive sense.

As previously explained, an embodiment of the disclosure may be (or include) a non-transitory machine-readable medium (such as microelectronic memory) having stored thereon instructions, which program one or more data processing components (generically referred to here as a "processor") to perform battery thermal management operations, such as controlling a pump in order to spray coolant on battery cells while the cells are discharging/charging. In other embodiments, some of these operations might be performed by specific hardware components that contain hardwired logic. Those operations might alternatively be performed by any combination of programmed data processing components and fixed hardwired circuit components.

While certain aspects have been described and shown in the accompanying drawings, it is to be understood that such aspects are merely illustrative of and not restrictive on the broad disclosure, and that the disclosure is not limited to the specific constructions and arrangements shown and described, since various other modifications may occur to those of ordinary skill in the art. The description is thus to be regarded as illustrative instead of limiting.

In some aspects, this disclosure may include the language, for example, "at least one of [element A] and [element B]." This language may refer to one or more of the elements. For example, "at least one of A and B" may refer to "A," "B," or "A and B." Specifically, "at least one of A and B" may refer to "at least one of A and at least one of B," or "at least of either A or B." In some aspects, this disclosure may include the language, for example, "[element A], [element B], and/or [element C]." This language may refer to either of the elements or any combination thereof. For instance, "A, B, and/or C" may refer to "A," "B," "C," "A and B," "A and C," "B and C," or "A, B, and C."

What is claimed is:

1. An InRow liquid cooling module for a data center, comprising:
    a main fluid distribution manifold having a main supply line that is configured to receive coolant from a coolant source and a main return line that is configured to return warmed coolant to the coolant source; and
    a mounting section that is configured to receive one or more cooling modules, wherein each cooling module is configured to 1) couple to the main supply line and to the main return line to circulate the coolant through the cooling module and 2) couple to a cold plate of a piece of IT equipment that is mounted in an electronic rack via a supply line and a return line to create a heat-transfer loop that transfers thermal energy away from the piece of IT equipment via the cold plate and into the coolant that circulates through the cooling module,
    wherein the supply line and the return line of each respective cooling module is arranged to extend out of the InRow liquid cooling module when coupling to a respective cold plate of a respective piece of IT equipment,
    wherein the InRow liquid cooling module is to be positioned adjacent to the electronic rack to provide liquid cooling to the IT equipment of the electronic rack and is to be coupled to the electronic rack only via the supply line and the return line of each respective cooling module, and
    wherein each of the cooling modules is one of a single-phase liquid-to-liquid heat exchanger and a two-phase liquid-to-liquid heat exchanger.

2. The InRow liquid cooling module of claim 1, wherein the InRow liquid cooling module and the electronic rack are separate components that are designed to be installed independently within the data center.

3. The InRow liquid cooling module of claim 1, wherein each cooling module is positioned higher than the piece of IT equipment in the electronic rack that is coupled to the cooling module to create a corresponding heat-transfer loop.

4. The InRow liquid cooling module of claim 1, wherein a cooling module comprises a fluid distribution manifold that is configured to couple to one or more pieces of IT equipment in order to create individual heat-transfer loops for each piece of IT equipment.

5. The InRow liquid cooling module of claim 4, wherein the fluid distribution manifold comprises a plurality of pairs of connectors, each pair of connectors having a supply connector and a return connector that are configured to removeably couple a respective piece of IT equipment of the one or more pieces of IT equipment to the cooling module.

6. The InRow liquid cooling module of claim 1, wherein a cooling module is coupled to the main supply line and the main return line via a cooling module supply connector and a cooling module return connector, each of which is configured to removeably couple the cooling module to the main fluid distribution manifold.

7. The InRow liquid cooling module of claim 1 further comprising a main valve that is coupled to one of the main supply line and the main return line and is configured to allow the coolant to circulate through the InRow liquid cooling module.

8. The InRow liquid cooling module of claim 7 further comprising a controller that is communicatively coupled to the main valve and is configured to change an opening ratio of the main valve to adjust a flow rate of the coolant that circulates through the InRow liquid cooling module.

9. The InRow liquid cooling module of claim 8, wherein at least one cooling module is coupled to at least one of the main supply line and the main return line via a valve, wherein the controller is communicatively coupled to the valve and is configured to change an opening ratio of the valve to adjust a flow rate of the coolant that circulates through the cooling module.

10. The InRow liquid cooling module of claim 9 further comprising a leak detection mechanism that is configured to detect a coolant leak within the InRow liquid cooling module,
wherein, in response to detecting a coolant leak within the main fluid distribution manifold, the leak detection mechanism is configured to instruct the controller to cause the main valve to close, and
wherein, in response to detecting a coolant leak within the at least one cooling module, the leak detection mechanism is configured to instruct the controller to cause the valve to close.

11. The InRow liquid cooling module of claim 1 further comprises an opening at a side of the InRow liquid cooling module, wherein the supply line and the return line of each respective cooling module is arranged to extend out of the opening at the side of the InRow liquid cooling module when coupling to the respective cold plate.

12. A data center cooling system comprising:
an electronic rack comprising a plurality of pieces of IT equipment arranged in a first stack, at least one of the pieces includes one or more servers to provide data processing services; and
an InRow liquid cooling module for a data center, the InRow liquid cooling module comprising:
a main fluid distribution manifold having a main supply line that is configured to receive coolant from a coolant source and a main return line that is configured to return warmed coolant to the coolant source, and
a mounting section that is configured to receive one or more cooling modules that are to be arranged in a second stack, each cooling module is configured to 1) couple to the main supply line and to the main return line to circulate the coolant through the cooling module and 2) couple to a cold plate of a piece of IT equipment that is mounted in the electronic rack via a supply line and a return line to create a heat-transfer loop that transfers thermal energy away from the piece of IT equipment via the cold plate and into the coolant that circulates through the cooling module,
wherein the supply line and the return line of each respective cooling module is arranged to extend out of the InRow liquid cooling module when coupling to a respective cold plate of a respective piece of IT equipment,
wherein the InRow liquid cooling module is to be positioned adjacent to the electronic rack to provide liquid cooling to the IT equipment of the electronic rack and is to be coupled to the electronic rack only via the supply line and the return line of each respective cooling module,
wherein each of the cooling modules is one of a single-phase liquid-to-liquid heat exchanger and a two-phase liquid-to-liquid heat exchanger.

13. The data center system of claim 12, wherein the InRow liquid cooling module and the electronic rack are separate components that are designed to be installed independently within the data center.

14. The data center system of claim 12, wherein each cooling module has a position in the second stack that is higher than the piece of IT equipment in the first stack that is coupled to the cooling module to create a corresponding heat-transfer loop.

15. The data center system of claim 12, wherein a cooling module of the one or more cooling modules comprise a fluid distribution manifold that is configured to couple to one or more pieces of IT equipment in order to create individual heat-transfer loops for each piece of IT equipment.

16. The data center system of claim 15, wherein the fluid distribution manifold comprises a plurality of pairs of connectors, each pair of connectors having a supply connector and a return connector that are configured to removeably couple a respective piece of IT equipment of the one or more pieces of IT equipment to the cooling module.

17. The data center system of claim 12, wherein a cooling module of the one or more cooling modules are coupled to the main supply line and the main return line via a cooling module supply connector and a cooling module return connector, each of which is configured to removeably couple the cooling module to the main fluid distribution manifold.

18. The data center system of claim 12, wherein the InRow liquid cooling module further comprises a main valve that is coupled to one of the main supply line and the main return line and is configured to allow the coolant to circulate through the InRow liquid cooling module.

19. The data center system of claim 18, wherein the InRow liquid cooling module further comprises a controller that is communicatively coupled to the main valve and is configured to change an opening ratio of the main valve to adjust a flow rate of the coolant that circulates through the InRow liquid cooling module.

20. The data center system of claim 19, wherein at least one cooling module is coupled to at least one of the main supply line and the main return line via a valve, wherein the controller is communicatively coupled to the valve and is configured to change an opening ratio of the valve to adjust a flow rate of the coolant that circulates through the cooling module.

21. The data center system of claim 20, wherein the InRow liquid cooling module further comprises a leak detection mechanism that is configured to detect a coolant leak within the InRow liquid cooling module, wherein, in response to detecting a coolant leak within the main fluid distribution manifold, the leak detection mechanism is configured to instruct the controller to cause the main valve to close, and wherein, in response to detecting a coolant leak within the at least one cooling module, the leak detection mechanism is configured to instruct the controller to cause the valve to close.

\* \* \* \* \*